United States Patent
Chowdhury et al.

(10) Patent No.: US 12,543,433 B2
(45) Date of Patent: Feb. 3, 2026

(54) LIGHT EXTRACTION STRUCTURE WITH HIGH INDEX NANOPARTICLES FOR AN ORGANIC LIGHT EMITTING DIODE

(71) Applicant: CORNING INCORPORATED, Corning, NY (US)

(72) Inventors: Dipakbin Qasem Chowdhury, Corning, NY (US); Sergey Anatol'evich Kuchinsky, St. Petersburg (RU); Dmitri Vladislavovich Kuksenkov, Elmira, NY (US); JooYoung Lee, Asan-Si (KR); Michal Mlejnek, Big Flats, NY (US); Hong Yoon, Asan-Si (KR)

(73) Assignee: CORNING INCORPORATED, Corning, NY (US)

( * ) Notice: Subject to any disclaimer, the term of this patent is extended or adjusted under 35 U.S.C. 154(b) by 791 days.

(21) Appl. No.: 17/262,375

(22) PCT Filed: Jul. 23, 2018

(86) PCT No.: PCT/RU2018/000484
§ 371 (c)(1),
(2) Date: Jan. 22, 2021

(87) PCT Pub. No.: WO2020/022920
PCT Pub. Date: Jan. 30, 2020

(65) Prior Publication Data
US 2021/0305539 A1    Sep. 30, 2021

(51) Int. Cl.
*H10K 50/854*    (2023.01)
*H10K 50/858*    (2023.01)
*H10K 102/00*    (2023.01)

(52) U.S. Cl.
CPC ......... *H10K 50/854* (2023.02); *H10K 50/858* (2023.02); *H10K 2102/00* (2023.02); *H10K 2102/331* (2023.02)

(58) Field of Classification Search
CPC .............. H10K 50/854; H10K 59/877; H10K 2102/331; H10K 50/858; H10K 59/879; H10K 2102/00; H10K 2101/00
See application file for complete search history.

(56) References Cited

U.S. PATENT DOCUMENTS 7,834,541 B2    11/2010  Cok
10,105,875 B2 *  10/2018 Young ................... B29C 59/022
(Continued)

FOREIGN PATENT DOCUMENTS

EP    2178343 A1    4/2010
EP    2378837 A1    10/2011
(Continued)

OTHER PUBLICATIONS

In2O3—SnO2 (Indium in oxide, ITO), Refractive index database (https://refractiveindex.info/) (Year: 2015).*
(Continued)

*Primary Examiner* — Ratisha Mehta
*Assistant Examiner* — Brad A Knudson

(57) ABSTRACT

An organic light emitting diode (OLED) assembly (100), comprising: a diode superstructure (110) comprising a cathode (140), an anode (120) having a refractive index of na, and an organic light emitting semiconductor material (160) interposed between the cathode (140) and the anode (120); and a light diffracting substructure (150) providing a scattering cross section of light from the diode superstructure (110). The light diffracting substructure (150) comprises: a transparent substrate (156), a plurality of nanoparticles (154) in contact with the substrate (156) and having a refractive
(Continued)

index of $n_s$, and a planarization layer (152) over the nanoparticles (154) and having a refractive index of $n_p$. Further, $n_p$ is within 25% of $n_a$ and $n_s > n_p$. In addition, $n_s >$ about 1.9.

21 Claims, 8 Drawing Sheets

(56) References Cited

U.S. PATENT DOCUMENTS

| | | | |
|---|---|---|---|
| 2006/0186801 | A1 | 8/2006 | West |
| 2011/0217544 | A1* | 9/2011 | Young .................. H01L 31/055 977/773 |
| 2011/0235327 | A1 | 9/2011 | Sasaki |
| 2013/0286659 | A1* | 10/2013 | Lee ........................ H10K 77/10 362/326 |
| 2014/0049822 | A1 | 2/2014 | Gollier et al. |
| 2014/0091292 | A1 | 4/2014 | Baker et al. |
| 2014/0140047 | A1 | 5/2014 | Sawabe et al. |
| 2014/0159029 | A1* | 6/2014 | Sawabe ................ H10K 50/858 257/40 |
| 2014/0197387 | A1* | 7/2014 | Miyao ...................... C08J 5/005 524/600 |
| 2014/0367672 | A1* | 12/2014 | Kim ...................... H10K 50/854 257/40 |
| 2015/0084005 | A1* | 3/2015 | Sista .................... H10K 50/854 257/40 |
| 2016/0380237 | A1* | 12/2016 | Mimoun .................. G02B 1/08 362/355 |
| 2017/0018741 | A1* | 1/2017 | Osawa .................... H10K 50/81 |
| 2017/0168224 | A1* | 6/2017 | McCamy ............... H10K 50/80 |

FOREIGN PATENT DOCUMENTS

| | | | |
|---|---|---|---|
| EP | 2803644 | A1 | 11/2014 |
| EP | 3119163 | A1 | 1/2017 |
| JP | 2010-140771 | A | 6/2010 |
| JP | 2014-103008 | A | 6/2014 |
| JP | 2015-534096 | A | 11/2015 |
| KR | 10-2016-0113217 | A | 9/2016 |
| TW | 201801370 | A | 1/2018 |
| WO | 2007/076913 | A1 | 7/2007 |
| WO | 2008/123303 | A1 | 10/2008 |
| WO | 2009/116531 | A1 | 9/2009 |
| WO | 2010/067687 | A1 | 6/2010 |
| WO | 2011/089343 | A1 | 7/2011 |
| WO | 2014/023886 | A1 | 2/2014 |
| WO | 2015/045599 | A1 | 4/2015 |
| WO | 2015/092222 | A1 | 6/2015 |
| WO | 2015/137205 | A1 | 9/2015 |

OTHER PUBLICATIONS

In2O3-SnO2 (Indium Tin Oxide, ITO), Refractive index database (https://refractiveindex. info/) (Year: 2015).*

Japanese Patent Application No. 2021-503851, Office Action, dated Nov. 2, 2022, 27 pages (13 pages of English Translation and 14 pages of Original Copy); Japanese Patent Office.

International Search Report and Written Opinion of the International Searching Authority; PCT/RU18/000484; Mailed Apr. 11, 2019; 13 Pages; European Patent Office.

Reineke et al., "White organic light-emitting diodes: Status and perspective", Rev. Mod. Phys., vol. 85, 2013, 53 pages.

Yamae et al., "Highly efficient white organic light-emitting diodes over 100 lm/W for next-generation solid-state lighting", Journal of the SID 21/12, 529 (2014).

Japanese Patent Application No. 2021-503851, Office Action, dated May 11, 2022, 25 pages (12 pages of English Translation and 13 pages of Original Copy); Japanese Patent Office.

Taiwanese Patent Application No. 108125764, Office Action, dated Jun. 13, 2023, 1 page; Taiwanese Patent Office.

* cited by examiner

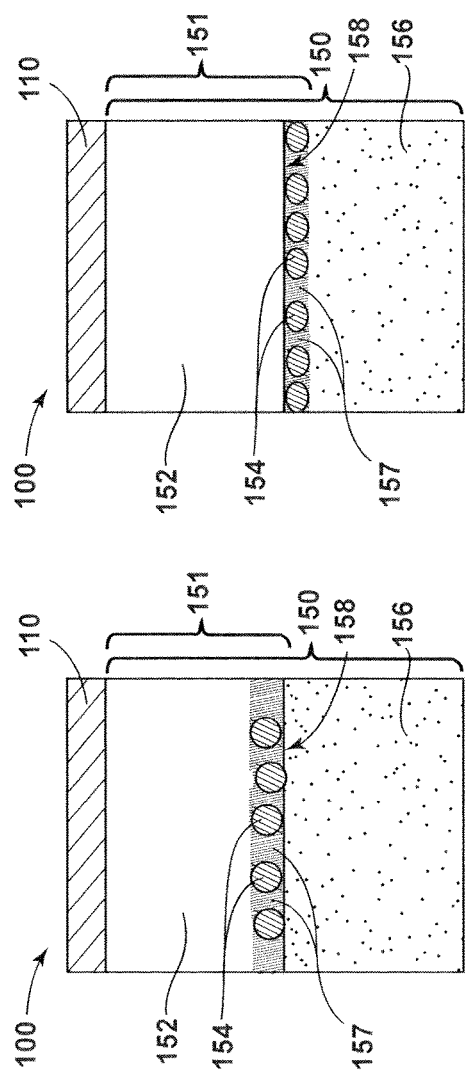
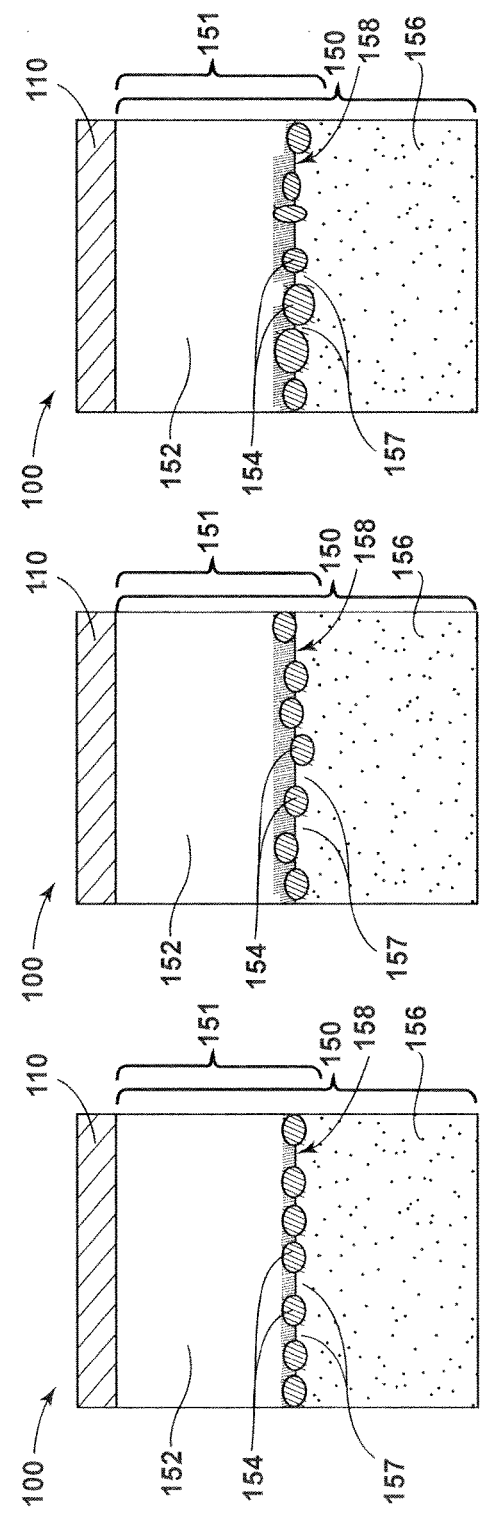

LIGHT EXTRACTION STRUCTURE WITH HIGH INDEX NANOPARTICLES FOR AN ORGANIC LIGHT EMITTING DIODE

This application claims the benefit of priority under 35 U.S.C. § 365 of International Patent Application No. PCT/RU2018/000484, filed on Jul. 23, 2018, designating the United States of America the content of which is relied upon and incorporated herein by reference in its entirety.

FIELD OF THE DISCLOSURE

The present disclosure relates generally to organic light emitting diodes (OLEDs), OLED-based lighting devices and OLED-based display devices; more particularly, the disclosure relates to light extraction structures, assemblies and elements for use with OLEDs, along with methods of making the same.

BACKGROUND

Image rendering devices that employ OLED technology are now widespread. One drawback of OLED technology is that light generated by the OLED active material (OAM) is prone to inefficient out-coupling from the device. The organic layers of the OLED often result in an inefficient planar waveguide for light transmission and out-coupling. More particularly, the light transmitted by the OLED, instead of being emitted perpendicularly to the plane of the individual semiconducting and conducting layers, can be trapped in the planar waveguide. This trapped light can then be absorbed by the lossy parts of the device or otherwise scattered in directions not in use or, in some cases, can displace the images rendered by the OLED device.

Although OLED-based lighting does not concern image production and image displacement problems, light transmission efficiency remains important. That is, efficiency, which means the number of useful, illuminating photons generated per the number of injected electrical carriers, is of high importance in OLED-based lighting applications. The internal quantum efficiency of OLED devices, which is the number of generated photons per number of recombining electrons and holes, can reach nearly perfect values, often exceeding 99%. The main problem is how to extract these photons in the direction useful for illumination, i.e., typically in the direction perpendicular to the OLED stack. Most of the photons trapped in the organic region of the OLED device never get out of the device, and are consumed in the interaction with surface plasmon-polaritons (SPP) of the conductors that are needed to supply the electrical charge carriers.

Accordingly, there is a need for OLED devices with increased light extraction efficiency (i.e., optical extraction (OE)) from the OAM of the OLEDs to air. In addition, there is need for high-efficiency OLED device configurations that can be manufactured with relatively low processing-related cost and high yields.

SUMMARY OF THE DISCLOSURE

According to some aspects of the present disclosure, an organic light emitting diode (OLED) assembly is provided that includes: a diode superstructure comprising a cathode, an anode having a refractive index of $n_a$, and an organic light emitting semiconductor material interposed between the cathode and the anode; and a light diffracting substructure providing a scattering cross section of light from the diode superstructure. The light diffracting substructure comprises: a transparent substrate, a plurality of nanoparticles in contact with the substrate and having a refractive index of $n_s$, and a planarization layer over the nanoparticles and having a refractive index of $n_p$. Further, $n_p$ is within 25% of $n_a$ and $n_s > n_p$. In addition, $n_s \geq$ about 1.9.

According to some aspects of the present disclosure, an organic light emitting diode (OLED) assembly is provided that includes: a diode superstructure comprising a cathode, an anode having a refractive index of $n_a$, and an organic light emitting semiconductor material interposed between the cathode and the anode; and a light diffracting substructure providing a scattering cross section of light from the diode superstructure. The light diffracting substructure comprises: a transparent substrate, a plurality of nanoparticles in contact with the substrate and having a refractive index of $n_s$, and a planarization layer over the nanoparticles and having a refractive index of $n_p$. Further, $n_p$ is within 25% of $n_a$, $n_s \geq n_p$ and $n_s \geq$ about 1.9. In addition, the plurality of nanoparticles ranges in size from about 200 nm to about 30 microns and is arranged in a monolayer on the substrate.

According to some aspects of the present disclosure, an organic light emitting diode (OLED) assembly is provided that includes: a diode superstructure comprising a cathode, an anode having a refractive index of $n_a$, and an organic light emitting semiconductor material interposed between the cathode and the anode; and a light diffracting substructure providing a scattering cross section of light from the diode superstructure. The light diffracting substructure comprises: a transparent substrate, a plurality of nanoparticles in contact with the substrate and having a refractive index of $n_s$, and a planarization layer over the nanoparticles and having a refractive index of $n_p$. Further, $n_p$ is within 25% of $n_a$, $n_s > n_p$ and $n_s \geq$ about 1.9. In addition, the OLED assembly comprises a light extraction efficiency of at least 40% into the substrate.

Additional features and advantages will be set forth in the detailed description which follows, and will be readily apparent to those skilled in the art from that description or recognized by practicing the embodiments as described herein, including the detailed description which follows, the claims, as well as the appended drawings.

It is to be understood that both the foregoing general description and the following detailed description describe various embodiments and are intended to provide an overview or framework to understanding the nature and character of the claimed subject matter.

The accompanying drawings are included to provide a further understanding of the various embodiments, and are incorporated into and constitute a part of this specification. The drawings illustrate the various embodiments described herein, and together with the description serve to explain the principles and operation of the claimed subject matter.

BRIEF DESCRIPTION OF THE DRAWINGS

The following is a description of the figures in the accompanying drawings. The figures are not necessarily to scale, and certain features and certain views of the figures may be shown exaggerated in scale or in schematic in the interest of clarity and conciseness.

In the drawings:

FIG. 2A is a schematic illustration of an OLED assembly with nanoparticles in contact with a substrate, according to an embodiment of the disclosure.

FIG. 2B is a schematic illustration of an OLED assembly with nanoparticles embedded in a substrate, according to an embodiment of the disclosure.

FIG. 2C is a schematic illustration of an OLED assembly with nanoparticles partially embedded in a substrate, according to an embodiment of the disclosure.

FIG. 2D is a schematic illustration of an OLED assembly with nanoparticles in contact with, embedded in, or partially embedded in, a substrate, according to an embodiment of the disclosure.

FIG. 2E is a schematic illustration of an OLED assembly with nanoparticles of varying shapes in contact with, embedded in, or partially embedded in, a substrate, according to an embodiment of the disclosure.

Figure 1:
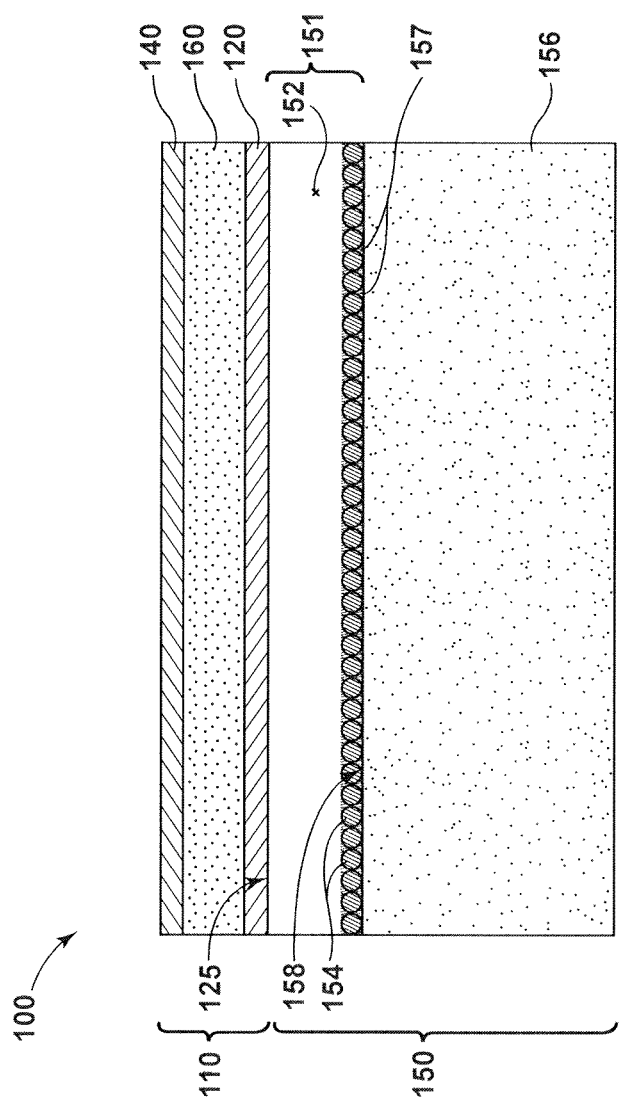
FIG. 1 is a schematic illustration of an OLED assembly, according to an embodiment of the disclosure.

The foregoing summary, as well as the following detailed description of certain inventive techniques, will be better understood when read in conjunction with the figures. It should be understood that the claims are not limited to the arrangements and instrumentality shown in the figures. Furthermore, the appearance shown in the figures is one of many ornamental appearances that can be employed to achieve the stated functions of the apparatus.

DETAILED DESCRIPTION OF THE PREFERRED EMBODIMENTS

Additional features and advantages will be set forth in the detailed description which follows and will be apparent to those skilled in the art from the description, or recognized by practicing the embodiments as described in the following description, together with the claims and appended drawings.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

In this document, relational terms, such as first and second, top and bottom, and the like, are used solely to distinguish one entity or action from another entity or action, without necessarily requiring or implying any actual such relationship or order between such entities or actions.

Modifications of the disclosure will occur to those skilled in the art and to those who make or use the disclosure. Therefore, it is understood that the embodiments shown in the drawings and described above are merely for illustrative purposes and not intended to limit the scope of the disclosure, which is defined by the following claims, as interpreted according to the principles of patent law, including the doctrine of equivalents.

For purposes of this disclosure, the term "coupled" (in all of its forms: couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature, or may be removable or releasable in nature, unless otherwise stated.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the end-points of each of the ranges are significant both in relation to the other end-point, and independently of the other end-point.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other, such as within about 5% of each other, or within about 2% of each other.

Directional terms as used herein—for example up, down, right, left, front, back, top, bottom—are made only with reference to the figures as drawn and are not intended to imply absolute orientation.

As used herein the terms "the," "a," or "an," mean "at least one," and should not be limited to "only one" unless explicitly indicated to the contrary. Thus, for example, reference to "a component" includes embodiments having two or more such components unless the context clearly indicates otherwise.

As also used herein, the term "nanoparticle", "nanoparticles", "particle" and "particles" are used interchangeably to refer to particles having a size (e.g., with regard to their largest dimension or diameter) from about 200 nm to about 30 microns or of a smaller range as specifically disclosed herein. Hence, the nanoparticles of the disclosure can include particles on a micron-scale, nano-scale, or both micron- and nano-scales.

As also used herein, the term "light extraction efficiency (EQE)" refers to the efficiency of the OLED structures of the disclosure in transmitting light from their light-emitting materials (e.g., their OLED active material) to air or another aspect of the device housing it.

As also used herein, the term "optical enhancement (OE)" refers to the enhancement factor of the OLED structures of the disclosure in transmitting the light from their light-emitting materials as compared to the same OLED structures without a light diffracting substructure.

As also used herein, the terms "index of refraction" and "refractive index" are used interchangeably to refer to a layer, element, assembly, structure, superstructure or substructure having a particular optical refractive index or an effective refractive optical index (e.g., as based on a summation of the refractive indices of its combination of materials).

As also used herein, the term "high index" is used to refer to a layer, element, assembly, structure, superstructure or substructure having a refractive index of at least 1.8.

As also used herein, the term "low index" is used to refer to a layer, element, assembly, structure, superstructure or substructure having a refractive index of 1.55 or less.

Referring to the drawings in general and to FIG. 1 in particular, it will be understood that the illustrations are for the purpose of describing particular embodiments and are not intended to limit the disclosure appended claims thereto. The drawings are not necessarily to scale, and certain features and certain views of the drawings may be shown exaggerated in scale or in schematic form in the interest of clarity and conciseness.

Described in this disclosure are organic light emitting diodes (OLEDs), OLED assemblies, OLED-based lighting devices and OLED-based display devices. The disclosure further details light extraction structures, assemblies and elements for use with OLEDs, along with methods of making the same. More generally, the OLED structures disclosed herein offer an increased optical enhancement (OE) from light transmitted by the OAMs of these structures to air. These OLED structures comprise an OLED lighting device coupled to a light diffracting substructure, and the light diffracting substructure includes a high index planarization layer, a scattering layer comprising nanoparticles and a substrate (e.g., a polymeric, glass or glass-ceramic substrate).

Embodiments of the OLED structures and assemblies disclosed herein address the need to increase the out-coupling efficiency of an OLED-based lighting device or other light-emitting OLED device, such as a display, and more specifically, a bottom- or top-emitting OLED device. The OLED structures and assemblies can achieve maximum utilization of the scattering and wave-guiding effects in the layers of materials deposited between a rigid or flexible low index substrate (e.g., a polymeric, glass or glass-ceramic substrate) and high index OAM to achieve greater light output for the OLED-based device for a given amount of light generated by the OAM. In some implementations, this optical enhancement (OE) can be achieved by the introduction of a high index planarization layer that resides adjacent to the OLED, a low index substrate in contact with the planarization layer, and high index nanoparticles (e.g., with a diameter on the order of or greater than the wavelength of the light generated by the OAM) within or otherwise coupled to the planarization layer and in contact with the substrate.

There are various advantages associated with the OLED structures and assemblies of the disclosure. One advantage is that the OLED assemblies of the disclosure demonstrate optical enhancement (OE) levels amounting to a greater than 2.5× increase in out-coupling efficiency over a conventional OLED device. Further, with OLED devices having OAM with lower signal loss levels, OE levels approaching a 3× increase in out-coupling efficiency are viable. Another important advantage of the OLED assemblies of the disclosure is that they can be fabricated with relatively simple manufacturing processes, particularly as compared to conventional OLED devices or other OLED devices with configurations alleged to increase OE levels.

Referring now to FIG. 1, a schematic illustration of an OLED assembly 100 is provided according to one embodiment of the disclosure. The illustrated OLED assembly 100 may comprise a diode superstructure 110 and a light diffracting substructure 150. The light diffracting substructure 150 can be used as a standalone apparatus for light diffraction (e.g., without the diode superstructure, as installed on another light transmission device or assembly). The diode superstructure 110 can comprise an anode 120, a cathode 140, and an organic light emitting semiconductor material 160 interposed between the anode 120 and the cathode 140. The light diffracting substructure 150 can comprise a transparent substrate 156, a light diffraction layer 151 distributed over a waveguide surface 158 of the transparent substrate 156. The diffraction layer 151 comprises a plurality of nanoparticles 154 and a planarization layer 152. The plurality of nanoparticles 154 is interposed between, or within either or both of, the transparent substrate 156 and the planarization layer 152. The transparent substrate 156 can comprise a glass, glass-ceramic, polymer, or combination of these materials.

Referring again to FIG. 1, the planarization layer 152 can have a refractive index of $n_p$. The transparent substrate 156 can have a refractive index of ng. The anode 120 can have a refractive index of $n_a$. Further, the plurality of nanoparticles 154 can have a refractive index $n_s$, as distributed over or within the transparent substrate 156. As also shown in FIG. 1, the plurality of nanoparticles 154 can have an optional binding matrix 157 between and/or surrounding the particles. When present, the binding matrix 157 can comprise the same material as the planarization layer 152, the transparent substrate 156, or another material, the material having a refractive index that is the same or substantially the same as the planarization layer 152 and the transparent substrate 156, or a combination of these materials. Further, according to some embodiments, the binding matrix 157 can have a refractive index that is between those of the planarization layer 152 and the transparent substrate 156.

According to some embodiments of the OLED assembly 100, the refractive index of the planarization layer 152 ($n_p$) is configured to be substantially similar to the refractive index of the anode 140 ($n_a$). In some implementations, the refractive index of the planarization layer ($n_p$) is within 25% of the refractive index of the anode 140 ($n_a$). According to some embodiments, the refractive index of the planarization layer ($n_p$) is within 25% of the refractive index of the anode 140 ($n_a$), within 20% of the refractive index of the anode 140 ($n_a$), within 15% of the refractive index of the anode 140 ($n_a$), within 10% of the refractive index of the anode 140 ($n_a$), within 5% of the refractive index of the anode 140 ($n_a$), or within a percentage of the refractive index of the anode 140 ($n_a$) between these values.

According to some implementations of the OLED assembly 100 depicted in FIG. 1, the refractive index of the plurality of nanoparticles 154 ($n_s$) is configured to be greater than the refractive index of the planarization layer 152 ($n_p$). In some implementations, the refractive index of the plurality of nanoparticles ($n_s$) is configured to be greater than the refractive index of the planarization layer ($n_p$) 152 by at least 5%, by at least 10%, by at least 15%, by at least 20%, by at least 25%, by at least 30%, by at least 35%, by at least 40%, by at least 45%, by at least 50%, by at least 55%, by at least 60%, or by an amount within these percentages. In some embodiments, the refractive index of the plurality of nanoparticles 154 ($n_s$) is ≥1.9, ≥2.0, ≥2.1, ≥2.2, ≥2.3, ≥2.4, ≥2.5, ≥2.6, ≥2.7, ≥2.8, ≥2.9, ≥3.0, or a refractive index between these values. According to some implementations, the refractive index of the plurality of nanoparticles 154 ($n_s$) is from about 1.9 to about 2.7, the refractive index of the planarization layer 152 ($n_p$), and the difference between $n_s$ and $n_p$ is at least 0.5.

As noted earlier, the OLED assembly 100 depicted in FIG. 1 can include a diode superstructure 110. The anode 120 of the superstructure 110 can be a transparent conductive oxide (TCO), such as indium tin oxide (ITO), that is transparent or substantially transparent to light emitted by the organic light emitting semiconductor material 160 and provides a suitable interface with the diode superstructure-engaging side 125 of the light diffracting substructure 150. Further, the cathode 140 may comprise any conductive material that has the appropriate work function to match the light emitting material 160. For example, the cathode may comprise Ag, Au, Al, Sm, Tm, Yb or bi-metallic materials, such as Ca: Al, Eu: Yb, or Tm: Yb. The thickness of the cathode 140 may be from about 70 nm to about 400 nm, from about 70 nm to about 300 nm, or from about 70 nm to about 200 nm. In some embodiments, when the thickness of the cathode 140 is below about 70 nm, the device can become bi-directional as light can escape the cathode as well. Under certain circumstances, this can be advantageous where additional components in the diode superstructure 110 are employed to harvest the light escaping the cathode 140. Therefore, some embodiments of the OLED assembly 100 can comprise a cathode 140 having a thickness from about 10 nm to about 70 nm, less than about 70 nm, or a thickness such that more than greater than 1% of the light emitted from OLED is emitted through the cathode 140.

Referring again to the OLED assembly 100 depicted in FIG. 1, the diode superstructure 110 can have a thickness of about 2 microns or less. In some implementations, the diode superstructure 110 has a thickness of 2.0 microns or less, 1.5 microns or less, 1 micron or less or, in some cases, less than 0.5 microns. In embodiments, the thickness of the plurality of nanoparticles 154, along with any binding matrix 157, is greater than the thickness of the diode superstructure 110. In other embodiments, the thickness of the plurality of nanoparticles 154, along with any binding matrix 157, is substantially the same as, or smaller than the thickness of the diode superstructure 110. According to some implementations of the OLED assembly 100, the thickness of the planarization layer 152 is from about 1 micron to about 30 microns, from about 1 micron to about 25 microns, from about 1 micron to about 20 microns, from about 1 micron to about 15 microns, from about 1 micron to about 10 microns, from about 1 micron to about 7.5 microns, or from about 1 micron to about 5 microns. The thickness of the planarization layer 152, in some implementations, can also be set at less than 1 micron, less than about 0.5 microns, or even less than about 0.3 microns.

Still referring to the OLE assembly 100 depicted in FIG. 1, the plurality of nanoparticles 154 can comprise $BaTiO_3$, BaO, $TiO_2$, $ZrO_2$, $Nb_2O_5$, $HfO_2$, ZnO, $Ta_2O_5$, $Al_2O_3$, their silicates, other metal oxides, or combinations thereof. In preferred embodiments, the plurality of nanoparticles 154 are fabricated from material(s) having a high refractive index, e.g., from about 1.9 to about 3.0, from about 1.9 to about 2.7, or from about 1.9 to about 2.5.

The plurality of nanoparticles 154 can take on a variety of shapes including, but not limited to, spherical, cubic, pyramidal, irregular and combinations thereof. The plurality of nanoparticles 154 can be arranged within a volume having a thickness less than the thickness of the planarization layer 152. The plurality of nanoparticles 154 can also be arranged in a monolayer within either or both of the planarization layer 152 and the transparent substrate 156. The plurality of nanoparticles can also be arranged in a monolayer on the substrate 156. Further, the plurality of nanoparticles 154 can range in size (e.g., with regard to their largest dimension or diameter) from about 200 nm to about 30 microns. In some implementations, the plurality of nanoparticles 154 can range in size from about 200 nm to about 30 microns, from about 200 nm to about 25 microns, from about 200 nm to about 20 microns, from about 200 nm to about 15 microns, from about 200 nm to about 10 microns, from about 200 nm to about 9 microns, from about 200 nm to about 8 microns, from about 200 nm to about 7 microns, from about 200 nm to about 6 microns, from about 200 nm to about 5 microns, from about 200 nm to about 4 microns, from about 200 nm to about 3 microns, from about 200 nm to about 2 microns, from about 200 nm to about 1 micron, or a size within these ranges. In embodiments, the plurality of the nanoparticles 154 can represent a single size distribution, or multiple size distributions, within these range endpoints, or within a subset of these range points, having the same or similar means and medians.

With regard to the optional binding matrix 157, it can reside between and/or surrounding the plurality of nanoparticles 154 as shown in FIG. 1. The binding matrix 157 can comprise the same material as the planarization layer 152, the transparent substrate 156, another material with a refractive index substantially similar to or between those of the planarization layer 152 and the transparent substrate 156, or a combination of these materials. In some implementations, the binding matrix 157 and the plurality of nanoparticles 154 can collectively form nanoparticle agglomerates.

Referring again to the OLED assembly 100 depicted in FIG. 1, the combination of the plurality of nanoparticles 154 and the binding matrix 157 can exhibit a surface roughness (RMS) of less than 0.05 microns, according to some embodiments. In some embodiments, this combination can have a surface roughness of less than about 0.03 microns. In some embodiments, this combination can have a surface roughness of about 0.05 microns to about 1 micron.

As also depicted in FIG. 1, the planarization layer 152 of the OLED assembly 100 can comprise any one or more of polymeric, glass, glass-ceramic and ceramic materials, or combinations thereof. In preferred embodiments, the planarization layer 152 is comprised of a material or material(s) selected to result in a refractive index that is similar, or substantially similar, to that of the anode 120. According to some embodiments, for example, the planarization layer 152 can be provided as a silica-, titania- or silica-titania-containing sol-gel or 'spin-on-glass' (SOG) polymeric material, e.g., a silsequioxane. The materials for the planarization layer 152 can be characterized by relatively high crack resistance (e.g., low shrinkage upon curing), may have the ability to fill nanoscale and microscale gaps (e.g., the surface roughness associated with the combination of the plurality of nanoparticles 154 and the binding matrix 157), and may generally be thermally stable. For example, the materials for the planarization layer 152 can be thermally stable up to about 450° C. in air. Beyond this temperature, the materials of the planarization layer 152 can become thermally unstable and/or break down.

According to some implementations of the planarization layer 152, it can be formed from one or more of the following polymeric materials containing one or more of silica, titania, zirconia and other metal oxides: a siloxane-based polymer with $TiO_2$ nanoparticles (e.g., VF-1800 siloxane polymer from Toray Industries, Inc.), partially polymerized polymethylsilsequioxane (e.g., T-II SOG from Honeywell, Inc.), poly-dimethyl-siloxane, poly-diphenyl-siloxane, partially polymerized polysilsequioxane, poly-methyl silsesquioxane (HardSil™ AM from Gelest Chemicals), poly-phenyl-silsesquioxane, poly-methyl-phenyl silsesquioxane (e.g., HardSil™ AP from Gelest Chemicals), SOG titanates (Ti-100, Ti-140, Ti-1000 from Desert Silicon) and SOG silica-titanate mixtures (e.g., Ti-452 from Desert Silicon). According to some embodiments, the planarization layer 152 can additionally include one or more fillers with relatively high refractive indices, such as anatase $TiO_2$, $ZnO_2$ and other metal oxides.

As noted earlier, the transparent substrate 156 depicted in FIG. 1 can comprise a glass, glass-ceramic, polymer, or combination of these materials. According to embodiments, the thickness of the substrate 156 can be from about 1 micron to about 30 microns. In some implementations, the thickness of the substrate 156 ranges from about 1 micron to about 30 microns, from about 1 micron to about 25 microns, from about 1 micron to about 20 microns, from about 1 micron to about 15 microns, from about 1 micron to about 10 microns, from about 1 micron to about 7.5 microns, or from about 1 micron to about 5 microns. According to an embodiment, the transparent substrate 156 can comprise Corning® Eagle XG® glass. In some implementations of the OLED assembly 100, the transparent substrate 156 comprises a thin, flexible glass substrate that can be employed in the assembly 100 according to roll-to-roll or roll-to-device processing, as understood by those with ordinary skill in the field of the disclosure. Further, the specific materials selected for the transparent substrate 156, as comprising a glass, can be gleaned from conventional and future teachings on the same subject. However, it should be noted that the concepts of the present disclosure are well suited for a variety of types of glass for the transparent substrate 156 including, for example, glasses manufactured in high volumes using, for example, a fusion draw process, and chemically strengthened, ion-exchanged glasses. According to some embodiments, the refractive index of the transparent substrate 156 can range from about 1.4 to about 1.55.

Referring again to the OLED assembly 100 depicted in FIG. 1, aspects of the OLED assembly can exhibit a light extraction efficiency (EQE) of at least 40% associated with light from its light-emitting material (e.g., the organic light emitting semiconductor material 160). According to some implementations of the OLED assembly 100, the assembly can exhibit a light extraction efficiency (EQE) of at least 30%, at least 35%, at least 40%, at least 45%, at least 50%, at least 55%, at least 60%, at least 65%, at least 70%, and all EQE values between these thresholds, as associated with light from its light-emitting material. In a preferred embodiment, the OLED assembly 100 can exhibit an EQE of at least 55% associated with light from its light-emitting material.

Still referring to the OLED assembly 100 depicted in FIG. 1, embodiments of the OLED assembly can exhibit an optical enhancement (OE) (i.e., as relative to the diode superstructure 110 without any light diffracting substructure or comparable assembly) of at least 1.5×. According to some embodiments of the OLED assembly, the assembly can exhibit an optical enhancement (OE) of at least 1.5×, at least 1.6×, at least 1.7×, at least 1.8×, at least 1.9×, at least 2.0×, at least 2.1×, at least 2.2×, at least 2.3×, at least 2.4×, at least 2.5×, at least 2.6×, at least 2.7×, at least 2.8×, at least 2.9×, at least 3.0×, at least 3.1×, at least 3.2×, at least 3.3×, at least 3.4×, at least 3.5×, and all OE levels between these thresholds. In a preferred embodiment, the OLED assembly 100 can exhibit an OE of at least 1.9×.

According to an embodiment, an exemplary organic light emitting diode (OLED) assembly 100 as depicted in FIG. 1 is provided that includes: a diode superstructure 110 comprising a cathode 140, an anode 120 having a refractive index of $n_a$, and an organic light emitting semiconductor material 160 interposed between the cathode 140 and the anode 120; and a light diffracting substructure 150 providing a scattering cross section of light from the diode superstructure 110. The light diffracting substructure 150 comprises: a transparent substrate 156, a plurality of nanoparticles 154 in contact with the substrate 156 and having a refractive index of $n_s$, and a planarization layer 152 over the nanoparticles 154 and having a refractive index of $n_p$. Further, $n_p$ is within 25% of $n_a$ and $n_s > n_p$. In addition, $n_s \geq$ about 1.9.

According to another embodiment, an exemplary organic light emitting diode (OLED) assembly 100 as depicted in FIG. 1 is provided that includes: a diode superstructure 110 comprising a cathode 140, an anode 120 having a refractive index of $n_a$, and an organic light emitting semiconductor material 160 interposed between the cathode 140 and the anode 120; and a light diffracting substructure 150 providing a scattering cross section of light from the diode superstructure 110. The light diffracting substructure 150 comprises: a transparent substrate 156, a plurality of nanoparticles 154 in contact with the substrate 156 and having a refractive index of $n_s$, and a planarization layer 152 over the nanoparticles 154 and having a refractive index of $n_p$. Further, $n_p$ is within 25% of $n_a$ and $n_s > n_p$ and $n_s \geq$ about 1.9. In addition, the plurality of nanoparticles 154 ranges in size from about 200 nm to about 30 microns and is arranged in a monolayer on the substrate 156.

According to a further embodiment, an exemplary organic light emitting diode (OLED) assembly 100 as depicted in FIG. 1 is provided that includes: a diode superstructure 110 comprising a cathode 140, an anode 120 having a refractive index of $n_a$, and an organic light emitting semiconductor material 160 interposed between the cathode 140 and the anode 120; and a light diffracting substructure 150 providing a scattering cross section of light from the diode superstructure 110. The light diffracting substructure 150 comprises: a transparent substrate 156, a plurality of nanoparticles 154 in contact with the substrate 156 and having a refractive index of $n_s$, and a planarization layer 152 over the nanoparticles 154 and having a refractive index of $n_p$. Further, $n_p$ is within 25% of $n_a$ and $n_s > n_p$ and $n_s \geq$ about 1.9. In addition, the OLED assembly 100 as depicted in FIG. 1 comprises a light extraction efficiency (EQE) of at least 40% into the substrate 156.

Referring now to FIG. 2A, a schematic illustration of an OLED assembly 100 as comprising a plurality of nanoparticles 154 in contact with a substrate 156 is depicted. As shown in FIG. 2A, a diode superstructure 110 is positioned over a light diffracting substructure 150. The light diffracting substructure 150 includes a transparent substrate 156 and a light diffraction layer 151, the diffraction layer 151 comprising a plurality of nanoparticles 154 and a planarization layer 152. More particularly, the plurality of nanoparticles 154 are arranged in a monolayer, surrounded by an optional binding matrix 157, and situated on the waveguide surface 158 of the substrate 156. In some embodiments, the light diffraction layer 151 can be formed by placement of the nanoparticles 154 on the waveguide surface 158 of the substrate 156, followed by a step of coating and curing the material of the planarization layer 152 and the binding matrix 157 (if present) over the nanoparticles. The resulting light diffracting substructure 150 can then be joined to the diode superstructure 110 (e.g., to the anode 120 of the superstructure—not shown in FIG. 2A).

Referring now to FIG. 2B, a schematic illustration of an OLED assembly 100 as comprising a plurality of nanoparticles 154 in contact with a substrate 156 is depicted. As shown in FIG. 2B, a diode superstructure 110 is positioned over a light diffracting substructure 150. The light diffracting substructure 150 includes a transparent substrate 156 and a light diffraction layer 151, the diffraction layer 151 comprising a plurality of nanoparticles 154 and a planarization layer 152. More particularly, the plurality of nanoparticles 154 are arranged in a monolayer, surrounded by an optional binding matrix 157, and embedded within the substrate 156 (e.g., in close proximity to the waveguide surface 158). In some embodiments, the light diffracting substructure 150 can be formed by coating and curing of a polymeric transparent substrate 156 with a suspension of nanoparticles 154 and optional binding matrix 157. For instance, the polymeric substrate 156 can be coated, followed by a coating of the nanoparticles 154 and binding matrix 157 (if present), and then each of these elements are cured together. Next, the material of the planarization layer 152 can be coated over the prior-formed substrate 156 (as comprising the nanoparticles 154), and then cured. The resulting light diffracting substructure 150 can then be joined to the diode superstructure 110 (e.g., to the anode 120 of the superstructure—not shown in FIG. 2B).

Referring now to FIG. 2C, a schematic illustration of an OLED assembly 100 as comprising a plurality of nanoparticles 154 in contact with a substrate 156 is depicted. As shown in FIG. 2C, a diode superstructure 110 is positioned over a light diffracting substructure 150. The light diffracting substructure 150 includes a transparent substrate 156 and a light diffraction layer 151, the diffraction layer 151 comprising a plurality of nanoparticles 154 and a planarization layer 152. More particularly, the plurality of nanoparticles 154 are arranged in a monolayer, surrounded by an optional binding matrix 157 and/or material from the planarization layer 152. Further, as shown in FIG. 2C, the plurality of nanoparticles 154 are partially embedded within the substrate 156 (e.g., in close proximity to the waveguide surface 158) and the planarization layer 152. In some embodiments, the light diffracting substructure 150 can be formed by coating and partially curing a polymeric transparent substrate 156 with a suspension of nanoparticles 154 and optional binding matrix 157, followed by a step of coating and partially curing the material of the planarization layer 152 over the partially cured substrate 156 (as comprising the nanoparticles 154). Finally, the partially cured planarization layer 152 and transparent substrate 156 (as comprising the nanoparticles 154 in a monolayer) are cured, thus joining them to form the light diffracting substructure 150. Alternatively, the transparent substrate 156 could be formed from a thermoplastic polymer, heated above its softening point, and the plurality of nanoparticles 154 are partially pressed into the substrate 156. At this point, the planarization layer 152 (and optional binding matrix 157) can be coated and subsequently cured over the nanoparticles 154 and substrate 156. The resulting light diffracting substructure 150 can then be joined to the diode superstructure 110 (e.g., to the anode 120 of the superstructure—not shown in FIG. 2C).

Referring now to FIG. 2D, a schematic illustration of an OLED assembly 100 as comprising a plurality of nanoparticles 154 in contact with a substrate 156 is depicted. As shown in FIG. 2D, a diode superstructure 110 is positioned over a light diffracting substructure 150. The light diffracting substructure 150 includes a transparent substrate 156 and a light diffraction layer 151, the diffraction layer 151 comprising a plurality of nanoparticles 154 and a planarization layer 152. More particularly, the plurality of nanoparticles 154 are arranged in an irregular monolayer or a plurality of layers, surrounded by a binding matrix 157 and material from the planarization layer 152, and partially embedded within the substrate 156 (e.g., in close proximity to the waveguide surface 158) and the planarization layer 152. In some embodiments, the light diffracting substructure 150 can be formed by coating and partially curing a polymeric transparent substrate 156 with a suspension of nanoparticles 154 and optional binding matrix 157, followed by a step of coating and partially curing the material of the planarization layer 152 over the partially cured substrate 156 (as comprising the nanoparticles 154). Finally, the partially cured planarization layer 152 and transparent substrate 156 (as comprising the nanoparticles 154 in an irregular monolayer or plurality of layers) are cured, thus joining them to form the light diffracting substructure 150. Alternatively, the transparent substrate 156 could be formed from a thermoplastic polymer, heated above its softening point, and the plurality of nanoparticles 154 are partially pressed into the substrate 156. At this point, the planarization layer 152 (and optional binding matrix 157) can be coated and subsequently cured over the nanoparticles 154 and substrate 156. The resulting light diffracting substructure 150 can then be joined to the diode superstructure 110 (e.g., to the anode 120 of the superstructure—not shown in FIG. 2D).

Referring now to FIG. 2E, a schematic illustration of an OLED assembly 100 as comprising a plurality of nanoparticles 154 in contact with a substrate 156 is depicted. As shown in FIG. 2E, a diode superstructure 110 is positioned over a light diffracting substructure 150. The light diffracting substructure 150 includes a transparent substrate 156 and a light diffraction layer 151, the diffraction layer 151 comprising a plurality of nanoparticles 154 having a plurality of shapes and/or sizes and a planarization layer 152. More particularly, the plurality of nanoparticles 154 are arranged in a monolayer, surrounded by an optional binding matrix 157 and material from the planarization layer 152, and partially embedded within the substrate 156 (e.g., in close proximity to the waveguide surface 158) and the planarization layer 152. In some embodiments, the light diffracting substructure 150 can be formed by coating and partially curing a polymeric transparent substrate 156 with a suspension of nanoparticles 154 (with varying shapes and/or sizes) and optional binding matrix 157, followed by a step of coating and partially curing the material of the planarization layer 152 over the partially cured substrate 156 (as comprising the nanoparticles 154). Finally, the partially cured planarization layer 152 and transparent substrate 156 (as comprising the nanoparticles 154 arranged in a monolayer) are cured, thus joining them to form the light diffracting substructure 150. Alternatively, the transparent substrate 156 could be formed from a thermoplastic polymer, heated above its softening point, and the plurality of nanoparticles 154 are partially pressed into the substrate 156. At this point, the planarization layer 152 (and optional binding matrix 157) can be coated and subsequently cured over the nanoparticles 154 and substrate 156. The resulting light diffracting substructure 150 can then be joined to the diode superstructure 110 (e.g., to the anode 120 of the superstructure—not shown in FIG. 2E).

Figures 3A, 3B:
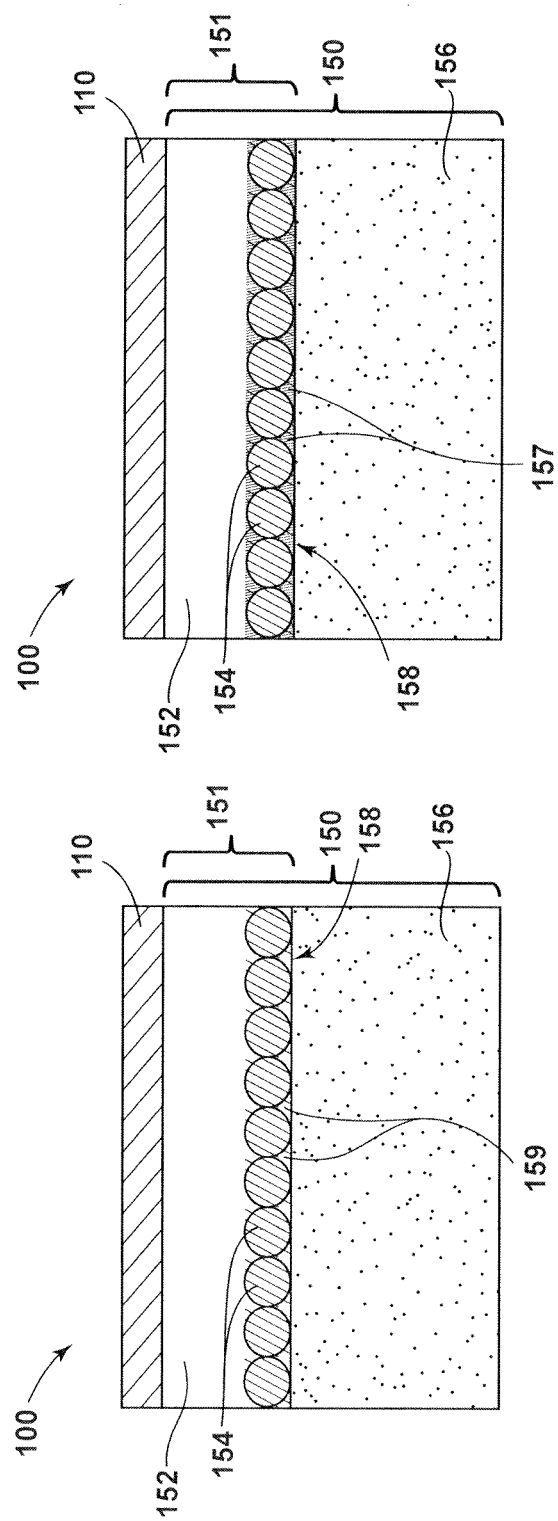
FIG. 3A is a schematic illustration of an OLED assembly with nanoparticles arranged in a close-packed monolayer in contact with a substrate and an air gap between the substrate and nanoparticles, according to an embodiment of the disclosure.
FIG. 3B is a schematic illustration of an OLED assembly with nanoparticles arranged in a close-packed monolayer in contact with a substrate, according to an embodiment of the disclosure.

Referring now to FIG. 3A, a schematic illustration of an OLED assembly 100 as comprising a plurality of nanoparticles 154 in contact with a substrate 156 is depicted. As shown in FIG. 3A, a diode superstructure 110 is positioned over a light diffracting substructure 150. The light diffracting substructure 150 includes a transparent substrate 156 and a light diffraction layer 151, the diffraction layer 151 comprising a plurality of nanoparticles 154 and a planarization layer 152. More particularly, the plurality of nanoparticles 154 are arranged in a dense-packed monolayer and situated on the waveguide surface 158 of the substrate 156. Further, air gaps 159 are located between each of the nanoparticles 154. In some embodiments, the light diffraction layer 151 can be developed by coating and curing a planarization layer 152 containing a suspension of nanoparticles 154 on a carrier (not shown). After the planarization layer 152 is formed with a dense-packed monolayer of nanoparticles 154 on a carrier, the resulting layer is separated from the carrier and then bonded to a transparent substrate 156 with a curable adhesive or some other bonding agent (not shown), thus resulting in the air gaps 159 as shown in FIG. 3A. Accordingly, formation of the air gaps 159, which are beneficial from the standpoint of their high refractive index, requires careful control of the process to bond the exposed nanoparticles 154 in the planarization layer 152 to the substrate 156. The resulting light diffracting substructure 150 can then be joined to the diode superstructure 110 (e.g., to the anode 120 of the superstructure—not shown in FIG. 3A).

Referring now to FIG. 3B, a schematic illustration of an OLED assembly 100 as comprising a plurality of nanoparticles 154 in contact with a substrate 156 is depicted. As shown in FIG. 3B, a diode superstructure 110 is positioned over a light diffracting substructure 150. The light diffracting substructure 150 includes a transparent substrate 156 and a light diffraction layer 151, the diffraction layer 151 comprising a plurality of nanoparticles 154 and a planarization layer 152. More particularly, the plurality of nanoparticles 154 are arranged in a dense-packed monolayer, surrounded by an optional binding matrix 157, and situated on the waveguide surface 158 of the substrate 156. In some embodiments, the light diffraction layer 151 can be formed by placement of the nanoparticles 154 on the waveguide surface 158 of the substrate 156, followed by a step of coating and curing the material of the planarization layer 152 and the optional binding matrix 157 over the nanoparticles 154. The resulting light diffracting substructure 150 can then be joined to the diode superstructure 110 (e.g., to the anode 120 of the superstructure—not shown in FIG. 3B). Compared to the OLED assembly 100 depicted in FIG. 3A and described earlier, the OLED assembly 100 depicted in FIG. 3B can obtain the same or better OE and EQE values with a simpler, lower-cost manufacturing process having less steps.

Figure 4:
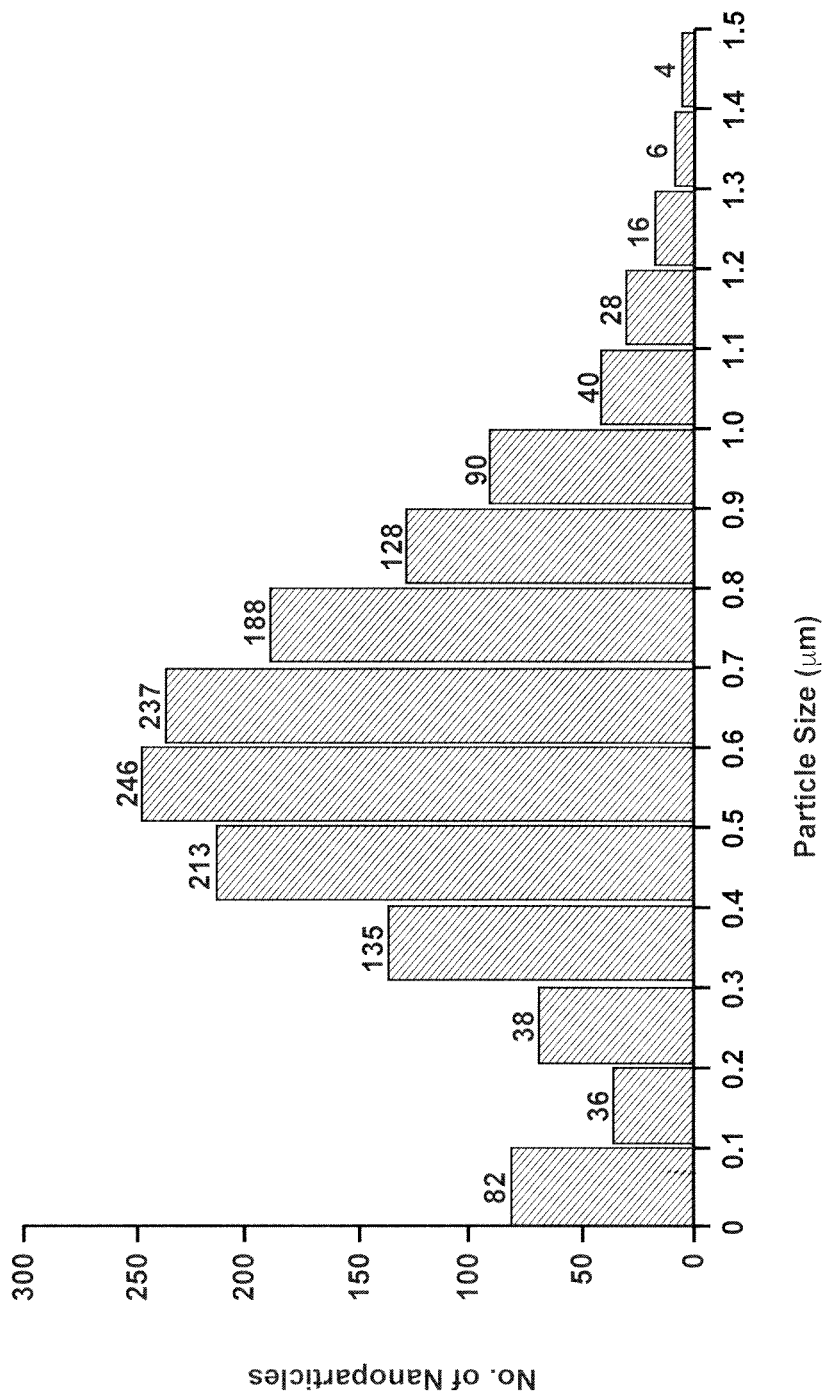
FIG. 4 is a plot of the size distribution of a plurality of nanoparticles suitable for an OLED assembly, according to an embodiment of the disclosure.

Referring now to FIG. 4, a plot is provided of the size distribution of a plurality of nanoparticles 154 that can be employed in the OLED assemblies 100 depicted in FIGS. 1-3B, according to an embodiment of the disclosure. More particularly, the nanoparticles 154 depicted in FIG. 4 comprise $BaTiO_3$ with a refractive index of about 2.4, exhibit a median and mean at about 0.6 microns, and range in size from about 0.05 microns to about 1.5 microns.

Figure 5A:
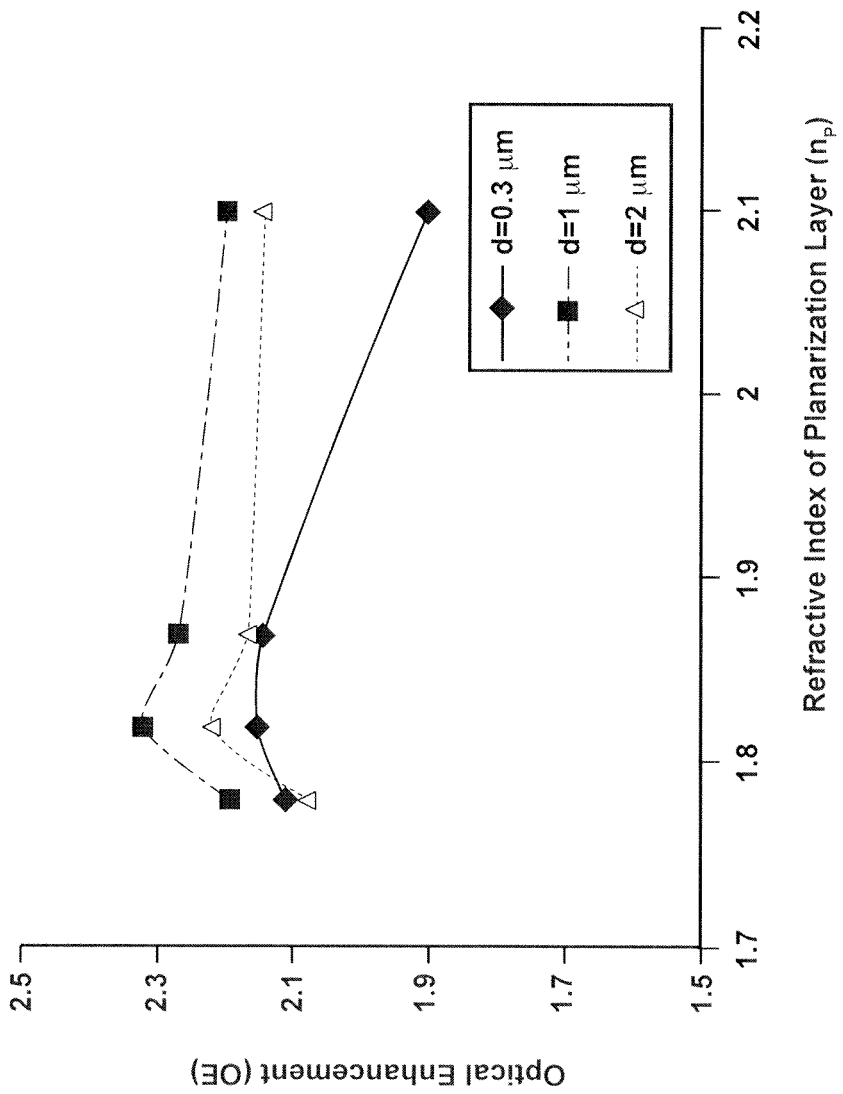
FIG. 5A is a plot of optical enhancement (OE) for three OLED assembly configurations with differing nanoparticle sizes as a function of the refractive index of their planarization layers, according to embodiments of the disclosure.

FIG. 5A is a plot of optical enhancement (OE) for three OLED assembly configurations (e.g., OLED assemblies 100 as depicted in FIG. 2A) with differing nanoparticle sizes as a function of the refractive index of their planarization layers, according to embodiments of the disclosure. The plot depicted in FIG. 5A presents estimated OE data as generated through modeling of an OLED assembly configuration consistent with OLED assembly depicted in FIG. 2A, assuming a planarization layer having a thickness of about 5 microns, a transparent substrate having a refractive index of 1.5 and an OLED with an anode having a refractive index of about 1.83 (e.g., ITO). As is evident from FIG. 5A, the OLED assemblies employing nanoparticles with an average size of about 1 micron demonstrated the best OE values, all having OEs >2.1×; however, the OLED assemblies employing nanoparticles with an average size of 0.3 microns and 2 microns likewise demonstrated good OE performance, all having OEs >1.9×. As is also evident from FIG. 5A, OE levels are at their optimum for OLED assemblies having a planarization layer with a refractive index from about 1.8 to about 1.9. Accordingly, some preferred OLED assemblies according to the disclosure are configured with a planarization layer having a refractive index of about 1.8 to about 1.9, or a refractive index below 1.8 or above 1.9 that is substantially matched to the refractive index of the anode of the OLED within the diode superstructure.

Figure 5B:
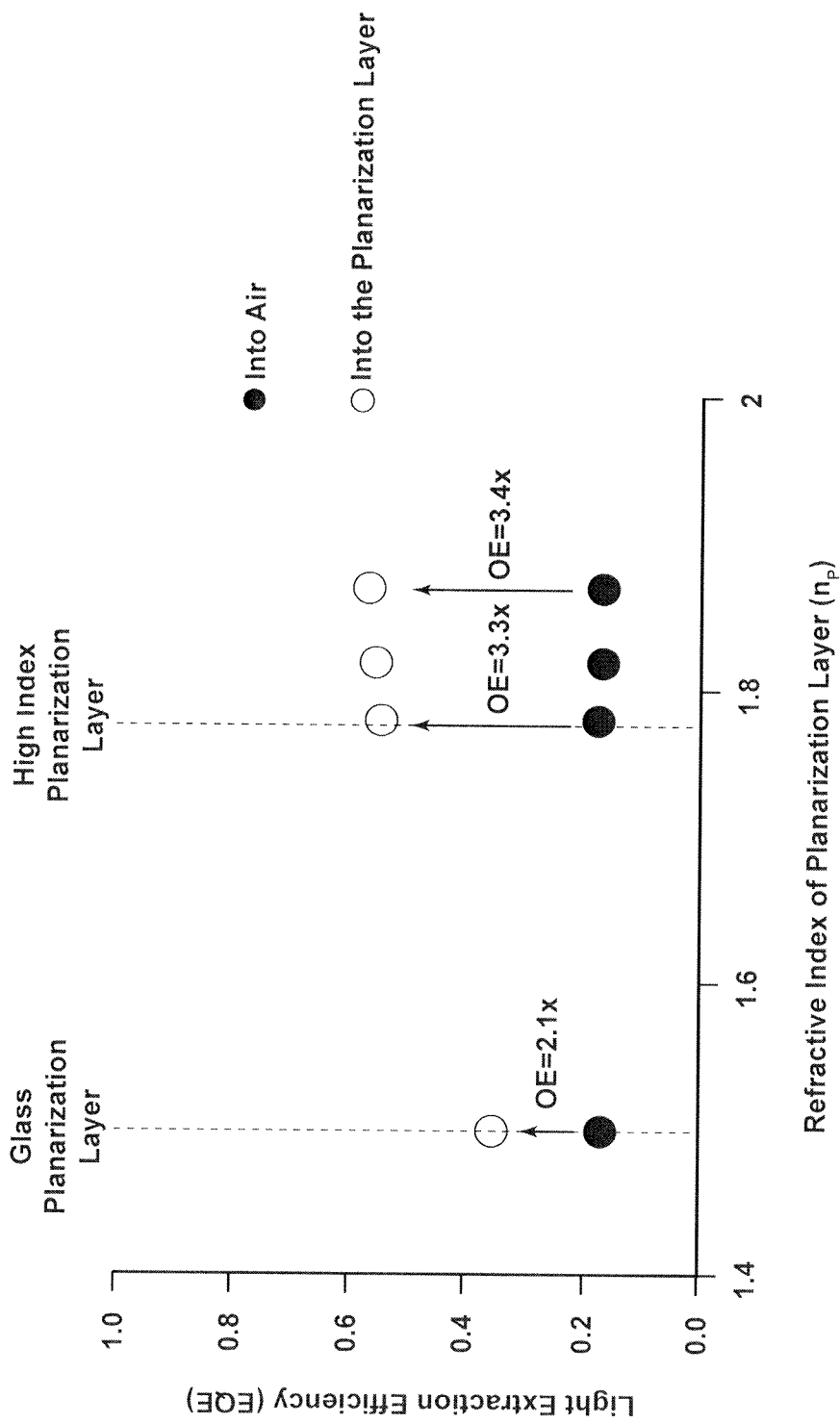
FIG. 5B is a plot of light extraction efficiency (EQE) for OLED assembly configurations with varying substrate refractive indices as compared to the extraction efficiency for the OLED assembly without a substrate into air, according to embodiments of the disclosure.

FIG. 5B is a plot of light extraction efficiency (EQE) for OLED assembly configurations with varying planarization layer refractive indices as compared to the extraction efficiency for the OLED assembly without a light diffracting substructure into air, according to embodiments of the disclosure. The plot depicted in FIG. 5B presents estimated OE data as generated through transfer matrix calculations according to an OLED assembly configuration consistent with OLED assembly depicted in FIG. 2A, assuming a planarization layer having a thickness of about 5 microns with varying refractive indices, an absence of nanoparticles, a transparent substrate having a refractive index of 1.5 and an OLED with an anode having a refractive index of about 1.83 (e.g., ITO). That is, the nanoparticles are not included in the model OLED assembly configuration to eliminate scattering effects, thus accentuating the effect of the refractive index of the planarization layer. As is evident from FIG. 5B, EQE values of about 2.1× are calculated for an OLED assembly with a planarization layer having a refractive index of about 1.5 (e.g., a glass layer). In contrast, EQE values of about 3.3-3.4× are calculated for OLED assemblies with a planarization layer having a refractive index of about 1.75 to about 1.9. Accordingly, preferred OLED assemblies according to the disclosure are configured with a planarization layer having a refractive index of about 1.75 to about 1.9, or a refractive index below 1.75 or above 1.9 that is substantially matched to the refractive index of the anode of the OLED within the diode superstructure.

Figure 5C:
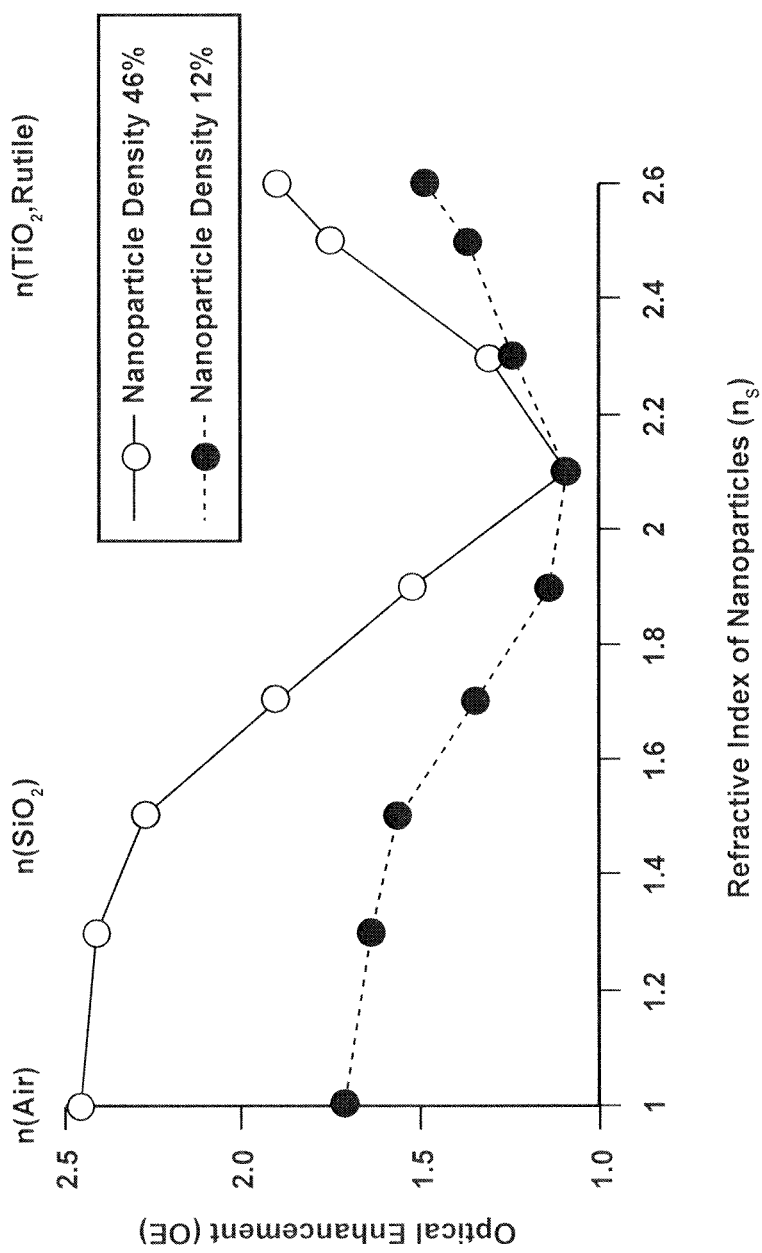
FIG. 5C is a plot of optical enhancement (OE) for two OLED assembly configurations having differing nanoparticle densities as a function of the refractive index of the nanoparticles, according to embodiments of the disclosure.

FIG. 5C is a plot of optical enhancement (OE) for two OLED assembly configurations having differing nanoparticle densities as a function of the refractive index of the nanoparticles, according to embodiments of the disclosure. The plot depicted in FIG. 5C presents estimated OE data as generated through modeling of an OLED assembly configuration consistent with OLED assembly depicted in FIG. 2A, assuming a planarization layer having a thickness of about 600 nm and a refractive index of 2.1, nanoparticles having a size of about 400 nm, a transparent substrate having a refractive index of 1.5 and an OLED with an anode having a refractive index of about 1.83 (e.g., ITO). Further, two OLED configurations were modeled with nanoparticle densities of 46% and 12% within the monolayer over the substrate (see, e.g., the OLED assemblies 100 depicted in FIGS. 3A and 2A, respectively). As is evident from FIG. 5C, the OLED assembly configurations having nanoparticles with a refractive index greater than 2.0 exhibit an increasing optical enhance (OE) level as the refractive index of the nanoparticles increases. Further, the OLED assembly configurations employing nanoparticles with a density of 46% exhibited higher OE levels as compared to the OLED assembly configurations employing nanoparticles having a density of 12%. Accordingly, maximizing the refractive index of the nanoparticles employed in the OLED assembly configurations of the disclosure can advantageously increase the OE levels of the OLED assembly.

The OLED assemblies 100 depicted in FIGS. 1-3B can be fabricated according to relatively low-cost manufacturing steps, according to embodiments of the disclosure. As noted earlier, the plurality of nanoparticles 154 can exhibit various shapes and be made from a variety of known processes. These processes include, but are not limited to, milling and flame hydrolysis. As another example, the plurality of nanoparticles 154 can comprise titania spheres as prepared from a colloidal solution produced according to a sol-gel synthesis process, as understood by those with ordinary skill in the field of the disclosure. Colloidal titania and barium titanate suspensions in various solvents, e.g., water and alcohol, can be mono-disperse, with particle sizes from about 200 nm to about 30 microns in diameter.

With further regard to the method of making the OLED assemblies 100 depicted in FIGS. 1-3B, the solutions, mixtures or suspensions of nanoparticles can be used to coat a monolayer of nanoparticles 154 on a transparent substrate 156 (e.g., as comprising a glass composition). The coating step can be accomplished using a variety of techniques known in the art, for example spin coating or slot die coating. One process that results in a near perfect hexagonally packed monolayer is known variously as a dip coating technique, a fluid forming technique, or a Langmuir-Blodgett technique. The dip coating process forms a monolayer of nanoparticles at the surface of a suitable liquid, and then the substrate is coated by immersing it in the liquid and slowly withdrawing it from the same. Another approach for forming a plurality of nanoparticles 154 is known as a layer-by-layer (LbL) process, which involves treating the waveguide surface 158 of the substrate 156 such that it experiences a negative charge and the nanoparticles with a positive charge. Further, the LbL process can then be employed to deposit the charged particles on the charged waveguide surface of the substrate with various approaches, e.g., spray, submersion and rinse, or slot die techniques.

Again referring to the method of making the OLED assemblies 100 depicted in FIGS. 1-3B, once the plurality of nanoparticles 154 is formed on the waveguide surface 158 of the substrate 156 (e.g., in a monolayer), a solution can be applied over the nanoparticles that dries or is cured into a solid material with the same or nearly the same refractive index as that of the substrate 156, e.g., silica sol-gel or various spin-on-glass (SOG) high-silica polymer materials such as silsesquioxanes. The liquid will penetrate the nanoparticles 154, thus forming a layer into which the nanoparticles are partially or fully submerged. This material becomes the binding matrix 157 upon drying and/or curing, and can serve to bind the particles to the substrate 156. As a variation of the method, the plurality of nanoparticles 154 and the binding matrix 157 can be deposited in a single coating step. For example, a suspension of the nanoparticles (e.g., titania or barium titanate) in a silica sol-gel or a silsesquioxane solution is first prepared. Further, if SOG polymers are employed as the binding matrix 157, they can subsequently be made fully inorganic by annealing at a sufficiently high temperature to oxidize the organic components out of the coating.

After the binding matrix 157 and the plurality of nanoparticles 154 is formed on the substrate 156 and cured, the planarization layer 152 of the OLED assemblies 100 (see FIGS. 1-3B) can be formed. As the high-index planarization layer is coated over the nanoparticles 154 and the binding matrix 157, it serves to remove any roughness of these elements, thus functioning as a planarizing coating. As noted earlier, the planarization layer 152 can comprise a titania sol-gel, an organic-inorganic hybrid material (e.g., a siloxane) filled with metal oxide nanoparticles (e.g., $TiO_2$ and/or $ZrO_2$). Once the planarization layer 152 is coated, it is then dried and cured according to conditions readily understood by those with ordinary skill in the field of the disclosure, as tailored to the particular composition of the planarization layer 152. Finally, the diode superstructure 110 is fabricated on top of the light diffracting substructure 150 in a conventional manner, starting with the anode 120 (e.g., ITO), and ending with the cathode 140 (e.g., aluminum), and any barrier layers required to protect the OLED layers from oxygen and moisture in the environment.

Figure 6B:
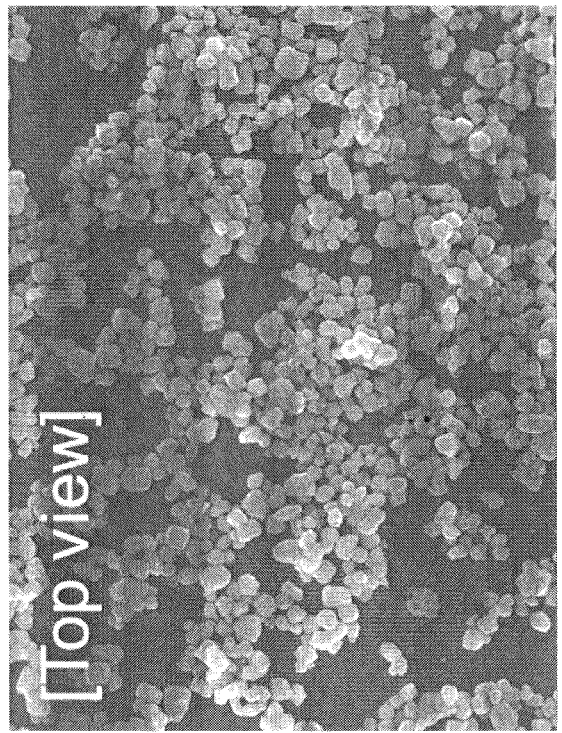
FIG. 6B is an SEM micrograph of a cross-section of an OLED assembly configuration, according to an embodiment of the disclosure.
Figure 6A:
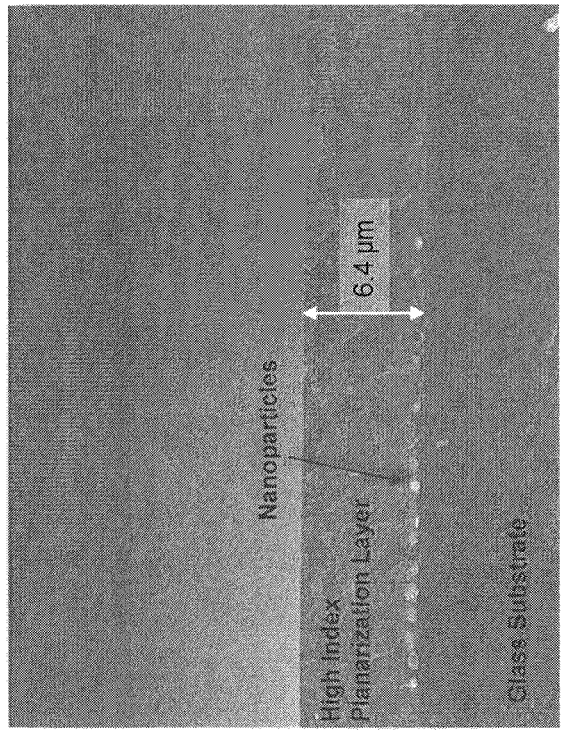
FIG. 6A is a scanning electron microscope (SEM) micrograph of nanoparticles distributed in a monolayer on a substrate, according to embodiments of the disclosure.

Referring now to FIG. 6A, a top view, scanning electron microscope (SEM) micrograph of $BaTiO_3$ nanoparticles distributed in a monolayer on a transparent glass substrate is provided, according to embodiments of the disclosure. As is evident from FIG. 6A, the nanoparticles are well-positioned on the glass substrate and have a size distribution ranging from about 500 nm to about 1 micron, which is expected to bring about wavelength-insensitive scattering strength. Further, the nanoparticles as shown in FIG. 6A are substantially in monolayer form. In addition, the surface density and particle size are adjustable parameters that can affect the light scattering afforded by the OLED assembly in which they are employed.

Referring now to FIG. 6B, a scanning electron micrograph (SEM) of a cross-section of an OLED assembly configuration is provided, e.g., as also depicted in FIGS. 1-3B, according to an embodiment of the disclosure. Here, the planarization layer over a monolayer of nanoparticles was developed through seven (7) coating and curing cycles to reach a final thickness of about 6.4 microns. It is also evident, but not shown, that the thickness of the planarization layer can be carefully controlled by selecting a particular number of coating and curing cycles. FIG. 6B also demonstrates that the nanoparticles are well-dispersed in a monolayer and AFM measurements (not shown) confirm that the final roughness of the planarization layer is less than about 20 nm (Rpv).

While exemplary embodiments and examples have been set forth for the purpose of illustration, the foregoing description is not intended in any way to limit the scope of disclosure and appended claims. Accordingly, variations and modifications may be made to the above-described embodiments and examples without departing substantially from the spirit and various principles of the disclosure. All such modifications and variations are intended to be included herein within the scope of this disclosure and protected by the following claims.

What is claimed is:

1. An organic light emitting diode (OLED) assembly, comprising:
    a diode superstructure comprising a cathode, an anode having a refractive index of $n_a$, and an organic light emitting semiconductor material interposed between the cathode and the anode; and
    a light diffracting substructure providing a scattering cross section of light from the diode superstructure,
    wherein the light diffracting substructure comprises: a transparent substrate, a plurality of nanoparticles comprising at least some nanoparticles partially embedded in the substrate and having a refractive index of $n_s$, and a planarization layer over the nanoparticles and having a refractive index of $n_p$,
    wherein $n_p$ is within 25% of $n_a$ and $n_s > n_p$,
    wherein $n_s \geq$ about 1.9,
    wherein $n_p$ is in a range of 1.7 to 2.1; and
    wherein the planarization layer has a thickness from 1 micron to 5 microns.

2. The OLED assembly according to claim 1, wherein the plurality of nanoparticles comprise barium oxide.

3. The OLED assembly according to claim 1, wherein the transparent substrate comprises a glass composition having a refractive index from about 1.4 to about 1.55.

4. The OLED assembly according to claim 1, wherein $n_s$ is from about 1.9 to about 2.7, $n_p$ is from about 1.8 to about 1.9, and the difference between $n_s$ and $n_p$ is at least 0.5.

5. An organic light emitting diode (OLED) assembly, comprising:
    a diode superstructure comprising a cathode, an anode having a refractive index of $n_a$, and an organic light emitting semiconductor material interposed between the cathode and the anode; and
    a light diffracting substructure providing a scattering cross section of light from the diode superstructure,
    wherein the light diffracting substructure comprises: a transparent substrate, a plurality of nanoparticles comprising at least some nanoparticles partially embedded in the substrate and having a refractive index of $n_s$, and a planarization layer over the nanoparticles and having a refractive index of $n_p$, and
    wherein $n_p$ is within 25% of $n_a$ and $n_s > n_p$,
    wherein $n_s \geq$ about 1.9,
    wherein $n_p$ is in a range of 1.7 to 2.1;
    wherein the plurality of nanoparticles ranges in size from about 200 nm to about 30 microns and is arranged in a monolayer, and
    wherein the planarization layer has a thickness from 1 micron to 5 microns.

6. The OLED assembly according to claim 5, wherein the plurality of nanoparticles comprises barium oxide.

7. The OLED according to claim 5, wherein the transparent substrate comprises a glass composition having a refractive index from about 1.4 to about 1.55.

8. The OLED assembly according to claim 5, wherein $n_s$ is from about 1.9 to about 2.7, $n_p$ is from about 1.8 to about 1.9, and the difference between $n_s$ and $n_p$ is at least 0.5.

9. The OLED assembly according to claim 5, wherein the plurality of nanoparticles ranges in size from about 200 nm to about 2 microns.

10. The OLED assembly according to claim 5, wherein the plurality of nanoparticles is embedded within a sublayer having a refractive index approximately equal to the refractive index of the substrate.

11. An organic light emitting diode (OLED) assembly, comprising:
    a diode superstructure comprising a cathode, an anode having a refractive index of $n_a$, and an organic light emitting semiconductor material interposed between the cathode and the anode; and
    a light diffracting substructure providing a scattering cross section of light from the diode superstructure,
    wherein the light diffracting substructure comprises: a transparent substrate, a plurality of nanoparticles comprising at least some nanoparticles partially embedded in the substrate and having a refractive index of $n_s$, and a planarization layer over the nanoparticles and having a refractive index of $n_p$, and
    wherein $n_p$ is within 25% of $n_a$ and $n_s > n_p$,
    wherein $n_s \geq$ about 1.9,
    wherein $n_p$ is in a range of 1.7 to 2.1;
    wherein the OLED assembly comprises a light extraction efficiency of at least 40% into the substrate, and
    wherein the planarization layer has a thickness from 1 micron to 5 microns.

12. The OLED assembly according to claim 11, wherein the plurality of nanoparticles comprises barium oxide.

13. The OLED assembly according to claim 11, wherein the transparent substrate comprises a glass composition having a refractive index from about 1.4 to about 1.55.

14. The OLED assembly according to claim 11, wherein $n_s$ is from about 1.9 to about 2.7, $n_p$ is from about 1.8 to about 1.9, and the difference between $n_s$ and $n_p$ is at least 0.5.

15. The OLED assembly according to claim 11, wherein the plurality of nanoparticles ranges in size from about 200 nm to about 2 microns.

16. The OLED assembly according to claim 11, wherein the plurality of nanoparticles is embedded within a sublayer having a refractive index approximately equal to the refractive index of the substrate.

17. The OLED assembly according to claim 11, wherein the OLED assembly comprises a light extraction efficiency of at least 55% into the substrate.

18. The OLED assembly according to claim 1, further comprising a second plurality of nanoparticles in contact with but not at least partially embedded in the substrate.

19. The OLED assembly according to claim 1, further comprising a binding matrix, wherein the plurality of nanoparticles are at least partially disposed in the binding matrix and wherein the plurality of nanoparticles and the binding matrix in combination exhibit a surface roughness (RMS) of less than 0.05 microns.

20. The OLED assembly according to claim 5, further comprising a binding matrix, wherein the plurality of nanoparticles are at least partially disposed in the binding matrix and wherein the plurality of nanoparticles and the binding matrix in combination exhibit a surface roughness (RMS) of less than 0.05 microns.

21. The OLED assembly according to claim 11, further comprising a binding matrix, wherein the plurality of nanoparticles are at least partially disposed in the binding matrix and wherein the plurality of nanoparticles and the binding matrix in combination exhibit a surface roughness (RMS) of less than 0.05 microns.

* * * * *